United States Patent
Tanaka

(10) Patent No.: US 8,934,260 B2
(45) Date of Patent: Jan. 13, 2015

(54) ELECTRONIC EQUIPMENT CABINET

(75) Inventor: Komei Tanaka, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 433 days.

(21) Appl. No.: 13/508,023

(22) PCT Filed: Nov. 9, 2009

(86) PCT No.: PCT/JP2009/069037
§ 371 (c)(1),
(2), (4) Date: Jul. 23, 2012

(87) PCT Pub. No.: WO2011/055454
PCT Pub. Date: May 12, 2011

(65) Prior Publication Data
US 2012/0286634 A1 Nov. 15, 2012

(51) Int. Cl.
*H05K 1/14* (2006.01)
*G06F 1/18* (2006.01)
*H05K 7/14* (2006.01)
*H05K 9/00* (2006.01)

(52) U.S. Cl.
CPC ............. *G06F 1/184* (2013.01); *H05K 7/1425* (2013.01); *H05K 9/0062* (2013.01)
USPC ............ 361/786; 361/737; 361/740; 361/752

(58) Field of Classification Search
CPC .. H05K 7/1402; H05K 7/1408; H05K 7/1422
USPC ....................................... 361/786
See application file for complete search history.

(56) References Cited

U.S. PATENT DOCUMENTS 4,503,484 A * 3/1985 Moxon .......................... 361/736
6,842,348 B2 * 1/2005 Lee ................................ 361/796
(Continued)

FOREIGN PATENT DOCUMENTS

JP 63-112386 U 7/1988
JP 4-99883 U 8/1992
(Continued)

OTHER PUBLICATIONS

International Search Report in PCT/JP2009/069037 dated Nov. 24, 2009 (English Translation Thereof).
(Continued)

*Primary Examiner* — Anthony Q Edwards
(74) *Attorney, Agent, or Firm* — McGinn IP Law Group, PLLC

(57) ABSTRACT

Provided is an electronic equipment cabinet capable of detecting a storage state of a circuit board unit by using a smaller number of switches than circuit board units. The electronic equipment cabinet, which stores a plurality of circuit board units inserted and extracted in the same direction, includes a plurality of slots for storing the circuit board units, a plurality of cover members for covering the slots, and a switch for detecting closing of all the slots. The cover members, which are provided by a plurality of types having an installation order restricting mechanism for preventing closing of the slots, except for when the cover members are installed according to a preset installation order, includes a driving member located in a final-installation cover member that is installed last and configured to drive the switch.

8 Claims, 4 Drawing Sheets

(56) References Cited

U.S. PATENT DOCUMENTS

| | | | |
|---|---|---|---|
| 7,173,817 B2 * | 2/2007 | Wei | 361/679.48 |
| 7,365,964 B2 * | 4/2008 | Donahue, IV | 361/622 |
| 2001/0014017 A1 | 8/2001 | Hanas et al. | |

FOREIGN PATENT DOCUMENTS

| JP | 04-215499 A | 8/1992 |
|---|---|---|
| JP | 7-29889 U | 6/1995 |
| JP | 2000-332479 A | 11/2000 |
| JP | 2002-076656 A | 3/2002 |
| JP | 2002-094268 A | 3/2002 |
| JP | 2004-172455 A | 6/2004 |
| JP | 2007-123582 A | 5/2007 |

OTHER PUBLICATIONS

International Search Report (ISR) (PCT Form PCT/ISA/210) dated Nov. 24, 2009 (previously submitted on May 3, 2012).

* cited by examiner

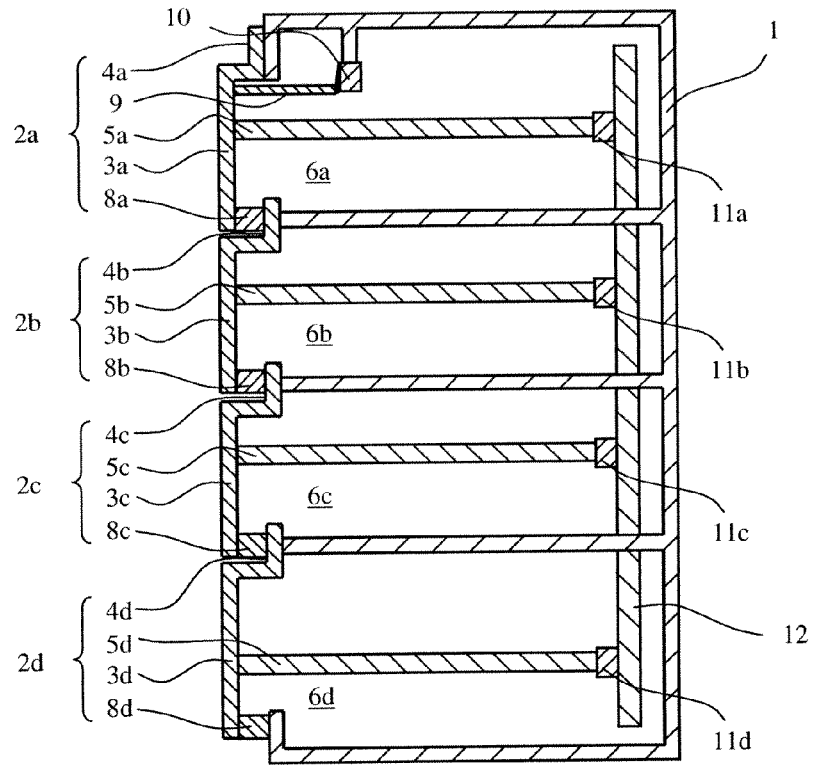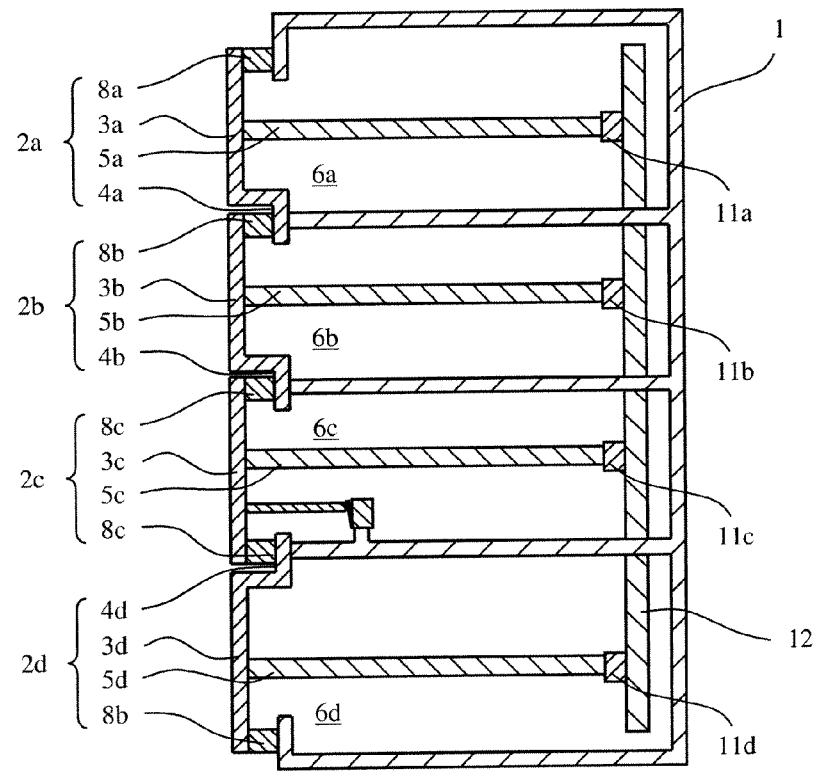

ELECTRONIC EQUIPMENT CABINET

TECHNICAL FIELD

The present invention relates to an electronic equipment cabinet for storing a circuit board unit. More particularly, the invention relates to an electronic equipment cabinet that needs a switch for detecting a storage state or a load state of a plurality of circuit board units.

BACKGROUND ART

As an electronic equipment cabinet for efficiently storing a circuit board unit, there is known a cabinet that includes slots to freely insert and extract circuit board units.

Arranging cover members in the circuit board units to cover the slot provides an advantage of simultaneously storing the circuit boards and closing the slots. Such an electronic equipment cabinet is generally employed for a personal computer and, in many cases, employed for a video device and a measuring device.

When the electronic equipment cabinet having the slots is employed for the video device, a gap between an outer wall of the cabinet and the cover member of the circuit board unit creates a possibility that EMI (Electro Magnetic Interference), such as electromagnetic wave leakage to the outside of the cabinet, may occur. JP2000-332479A (Patent Literature 1) discloses a method for improving the effects of reducing EMI by forming a gasket in the gap between the cabinet and the cover member to close the gap, thereby improving shielding performance.

In recent years, for security purposes, there has been known an electronic equipment cabinet that includes a switch to detect storage of a circuit board unit in a slot of the cabinet. JP2004-172455A (Patent Literature 2) discloses an electronic equipment cabinet that includes a switch and can detect a storage state or a load state based on the contact state between a part of the cover member and the switch.

In the electronic equipment cabinet for storing the plurality of circuit board units, the inclusion of a switch corresponding to each circuit board unit increases the number of components, thus increasing costs. The switch itself becomes an EMI antenna, and hence when there are many switches, the influence of EMI easily appears.

In particular, the recent enlargement of the video device requires displaying of a video with higher accuracy and smoother representation of motion. This necessitates video data of a wider band, and a clock of the video device has become faster. The faster clock generates greater noise, and the influence of EMI has become more conspicuous in the video device.

CITATION LIST

Patent Literature

Patent Literature 1: JP2000-332479A
Patent Literature 2: JP2004-172455A

SUMMARY OF INVENTION

An example of an object of the present invention is therefore to provide an electronic equipment cabinet capable of detecting the storage state of a circuit board unit by using a smaller number of switches than circuit board units.

To achieve the object, according to an aspect of the present invention, an electronic equipment cabinet, which stores a plurality of circuit board units inserted and extracted in the same direction, includes a plurality of slots for storing the circuit board units, a plurality of cover members for covering the slots, and a switch for detecting closing of all the slots. The cover members, which are provided by a plurality of types having an installation order restricting mechanism for preventing closing of the slots, except for when the cover members are installed according to a preset installation order, includes a driving member located in a final-installation cover member that is installed last and configured to drive the switch.

According to the present invention, the storage state of the circuit board unit can be detected by using a smaller number of switches than circuit board units.

BRIEF DESCRIPTION OF DRAWINGS

FIG. 6 is a sectional view showing an electronic equipment cabinet according to a second exemplary embodiment.

FIG. 7 is a sectional view showing an electronic equipment cabinet according to a third exemplary embodiment.

DESCRIPTION OF EMBODIMENTS

Figure 1:
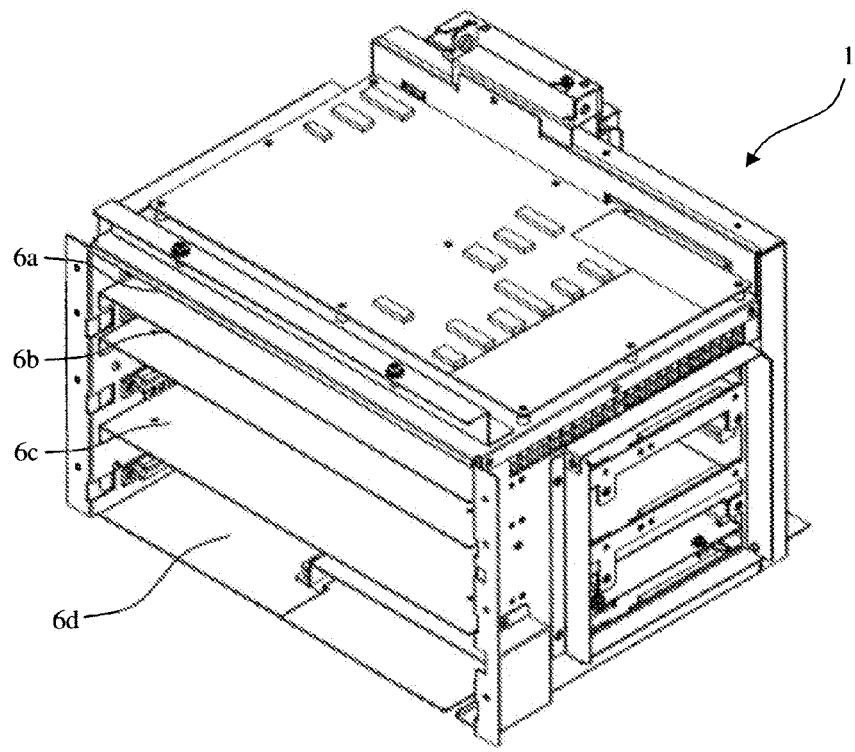
FIG. 1 is a perspective view showing an electronic equipment cabinet according to a first exemplary embodiment of the present invention.
Figure 2:
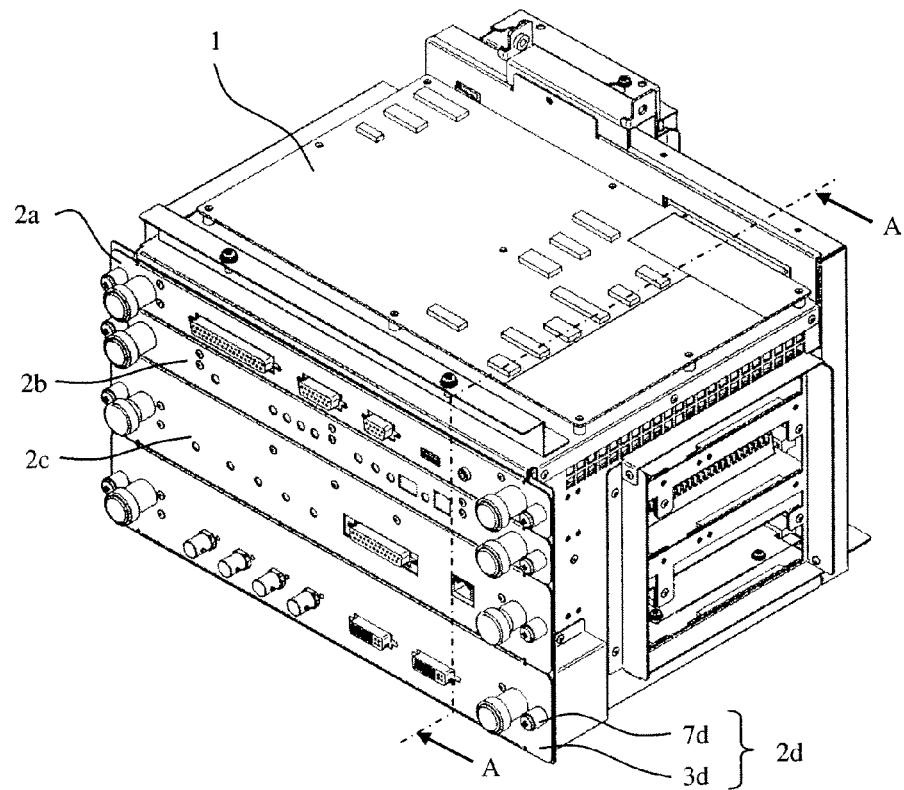
FIG. 2 is a perspective view when circuit board units are stored in the electronic equipment cabinet.

Hereinafter, exemplary embodiments of the present invention are described. FIG. 1 is a perspective view showing an electronic equipment cabinet according to a first exemplary embodiment of the present invention. FIG. 2 is a perspective view when circuit board units are stored in the electronic equipment cabinet.

As shown in FIG. 1, electronic equipment cabinet 1 includes slots 6a, 6b, 6c, and 6d formed in sequence to store circuit board units 2a, 2b, 2c, and 2d inserted and extracted in the same direction. As shown in FIG. 2, circuit board units 2a, 2b, 2c, and 2d are inserted into slots 6a, 6b, 6c, and 6d to be stored in electronic equipment cabinet 1.

Figure 3:
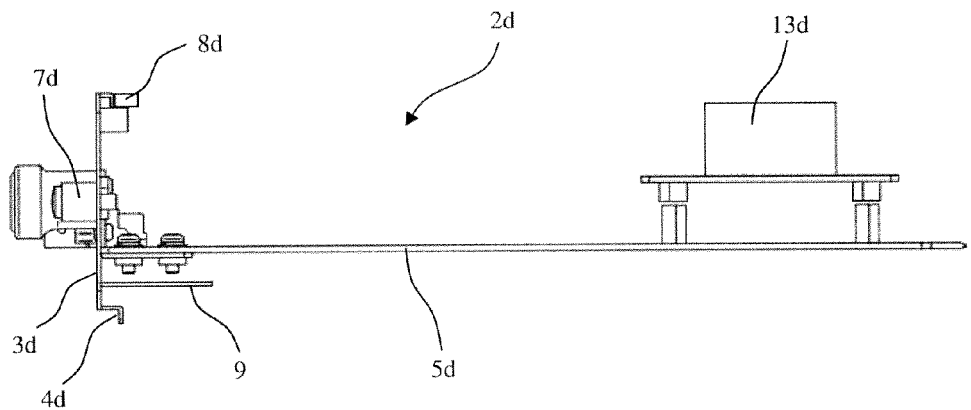
FIG. 3 is a side view showing a circuit board unit.
Figure 4:
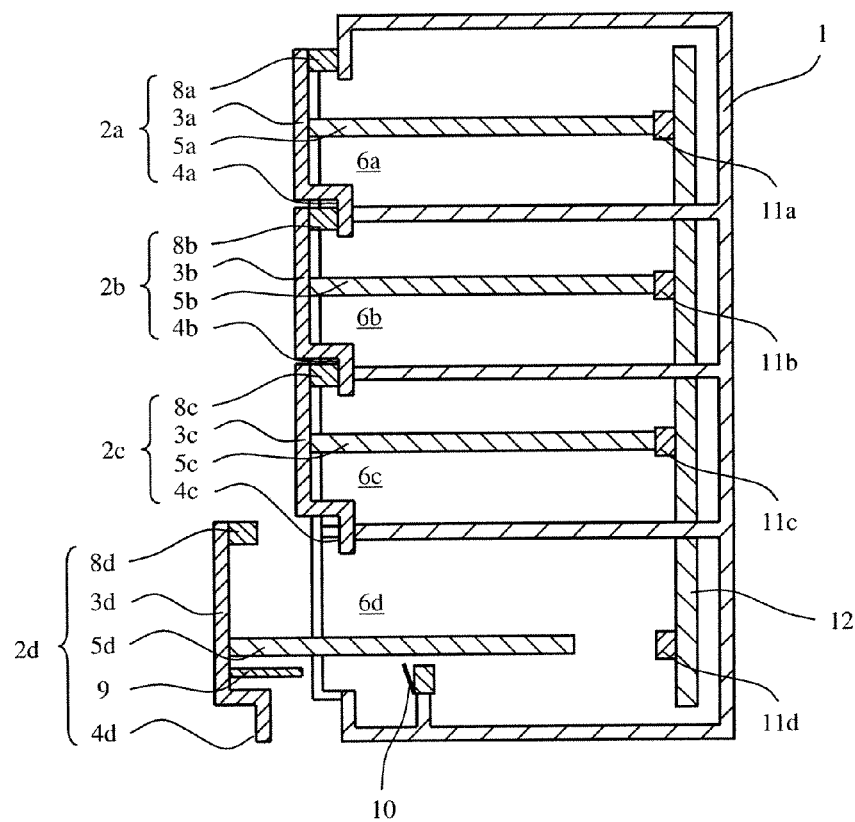
FIG. 4 is a sectional view showing the electronic equipment cabinet.

FIG. 3 is a side view showing circuit board unit 2d stored in slot 6d of electronic equipment cabinet 1. FIG. 4 is a sectional view (A-A section shown in FIG. 2) when circuit board units 2a, 2b, 2c, and 2d are stored in slots 6a, 6b, 6c, and 6d.

As shown in FIG. 3, circuit board unit 2d includes cover member 3d to cover slot 6d, and circuit board 5d having electronic component 13d. Cover member 3d has screw 7d formed to fix circuit board unit 2d to an outer wall of electronic equipment cabinet 1.

At a lower end of cover member 3d, base 4 is formed to be a step in a direction for inserting circuit board unit 2d into slot 6d. At an upper end of cover member 3d, gasket 8d is similarly formed in the inserting direction into slot 6d.

When circuit board unit 2d is stored in slot 6d, the upper end of cover member 3d overlaps a surface of the lower end of adjacent cover member 3c (FIG. 4). Thus, the upper end (hereinafter, referred to as gasket) of cover member 3d is bent so that gasket 8d of cover member 3d can come into contact with base 4c of cover member 3c.

Further, cover member 3d includes driving member 9 formed to drive switch 10 (FIG. 4) for detecting closing of slot 6d by cover member 3d. In this exemplary embodiment, a projection is formed as driving member 9.

Cover member 3d is made of a conductive material having a plate thickness of about 1 millimeter, and a depth of base 4 formed at the lower end of cover member 3d is designed to be 5.5 millimeters. Gasket 8d is also made of a conductive material having a thickness of about 1 millimeter. Using the conductive materials for cover member 3d and gasket 8 improves EMI shielding performance.

Circuit board units 2a, 2b, and 2c are similar in configuration to circuit board unit 2d. However, as described below, in this exemplary embodiment, it is only cover member 3d that closes lowermost slot 6d that comes into contact with switch 10. This eliminates the necessity of forming any driving member 9 in cover members 3a, 3b, and 3c.

As shown in FIG. 4, connectors 11a, 11b, 11c, and 11d electrically connectable to circuit boards 5a, 5b, 5c, and 5d are arranged in electronic equipment cabinet 1. Connectors 11a, 11b, 11c, and 11d are fixed to mother board 12 in electronic equipment cabinet 1, and are electrically interconnected via mother board 12.

Thus, inserting circuit boards 5a, 5b, 5c, and 5d into connectors 11a, 11b, 11c, and 11d enables exchanging of electric signals among circuit boards 5a, 5b, 5c, and 5d. Connectors 11a, 11b, 11c, and 11d can be directly fixed to electronic equipment cabinet 1 as long as they are electrically interconnected.

Gasket 8a is disposed in a contact position between a top surface of electronic equipment cabinet 1 and cover member 3a, and hence there is no gap between electronic equipment cabinet 1 and cover member 3a. Gaskets 8b, 8c, and 8d are also arranged in contact positions between cover members 3a and 3b, 3b and 3c, and 3c and 3d, and bases 4a, 4b, 4c, and 4d are formed at lower ends of cover members 3a, 3b, 3c, and 3d to improve sealing. As a result, there is no gap between adjacent cover members 3a and 3b, 3b and 3c, and 3c and 3d, enabling reduction of the influence of EMI.

Further, in electronic equipment cabinet 1, switch 10 is disposed only in lowermost slot 6d. Switch 10 comes into contact with driving member 9 to detect closing of slot 6d by cover member 3d. In this exemplary embodiment, the switch detects the closing by contact. However, the present invention is not limited to the contact-type switch. For example, an optical detection switching can be used.

Next, a method for detecting storage states of circuit board units 2a, 2b, 2c, and 2d according to the present invention is described.

In circuit board unit 2a stored in uppermost slot 6a, gasket 8a formed at the upper end of first cover member 3a abuts on the top surface of electronic equipment cabinet 1. In circuit board unit 2b stored in slot 6b second from the top, gasket 8b formed at the upper end of second cover member 3b abuts on base 4a formed at the lower end of first cover member 3a.

Thus, in a state where circuit board unit 2b stored after unit 2a is fixed to electronic equipment cabinet 1, a back side of cover member 3b overlaps a front side of cover member 3a, and hence circuit board unit 2a stored first is also fixed to electronic equipment cabinet 1. To pull out circuit board unit 2a from electronic equipment cabinet 1, circuit board unit 2b must be pulled out.

Because of base 4a formed at the end of cover member 3a, when circuit board unit 2a is stored after circuit board unit 2b has been stored in electronic equipment cabinet 1, a front side of the gasket interferes with a back side of base 4a. This inhibits storage of circuit board unit 2a after circuit board unit 2b has been stored, necessitating first installation of cover member 3a. In other words, base 4a and the gasket constitute an installation order restricting mechanism for preventing closing of slot 6a except for when the cover members are installed according to a preset installation order.

A relationship between circuit board unit 2c stored in slot 6c third from the top and circuit board unit 2b is similar to that between circuit board unit 2b and circuit board unit 2a. Specifically, gasket 8c formed at the upper end of cover member 3c abuts on base 4b formed at the lower end of cover member 3b, and circuit board unit 2b is fixed by circuit board unit 2c stored after unit 2b.

Similarly, circuit board unit 2c is fixed by circuit board unit 2d stored in slot 6d fourth from the top, namely, lowermost slot 6d in this exemplary embodiment. This inhibits pulling-out of previously stored circuit board units 2a, 2b, and 2c before circuit board unit 2d is pulled out. It can therefore be understood that when storage of lastly stored circuit board unit 2d in slot 6 is detected, circuit board units 2a, 2b, and 2c will also have been stored.

In other words, when cover member 3d is removed from electronic equipment cabinet 1, only cover member 3d moves away from electronic equipment cabinet 1 while other cover members 3a, 3b, and 3c are not separated from electronic equipment cabinet 1. When one of cover members 3a, 3b, and 3c corresponding to slots 6a, 6b, and 6c is removed from electronic equipment cabinet 1, cover member 3d corresponding to slot 6d is always separated.

To achieve such a relationship, cover members 3a, 3b, 3c, and 3d overlap one another at the ends in a direction where slots 6a, 6b, 6c, and 6d are formed. This requires only one switch 10 to detect an installed state of cover member 3d that becomes a final-installation cover member.

Thus, in this exemplary embodiment, switch 10 is disposed in lowermost slot 6d. The storage of circuit board unit 2d causes contact between driving member 9 and switch 10, thereby enabling detection of a storage state of circuit board unit 2d and storage states of other circuit board units 2a, 2b, and 2c.

The cover members are classified into a plurality of types. Specifically, they are first cover member 3a installed first in the cabinet, second cover members 3b and 3c installed after the installation of first cover member 3a, and cover member 3d that becomes a final-installation cover member.

Figure 5:
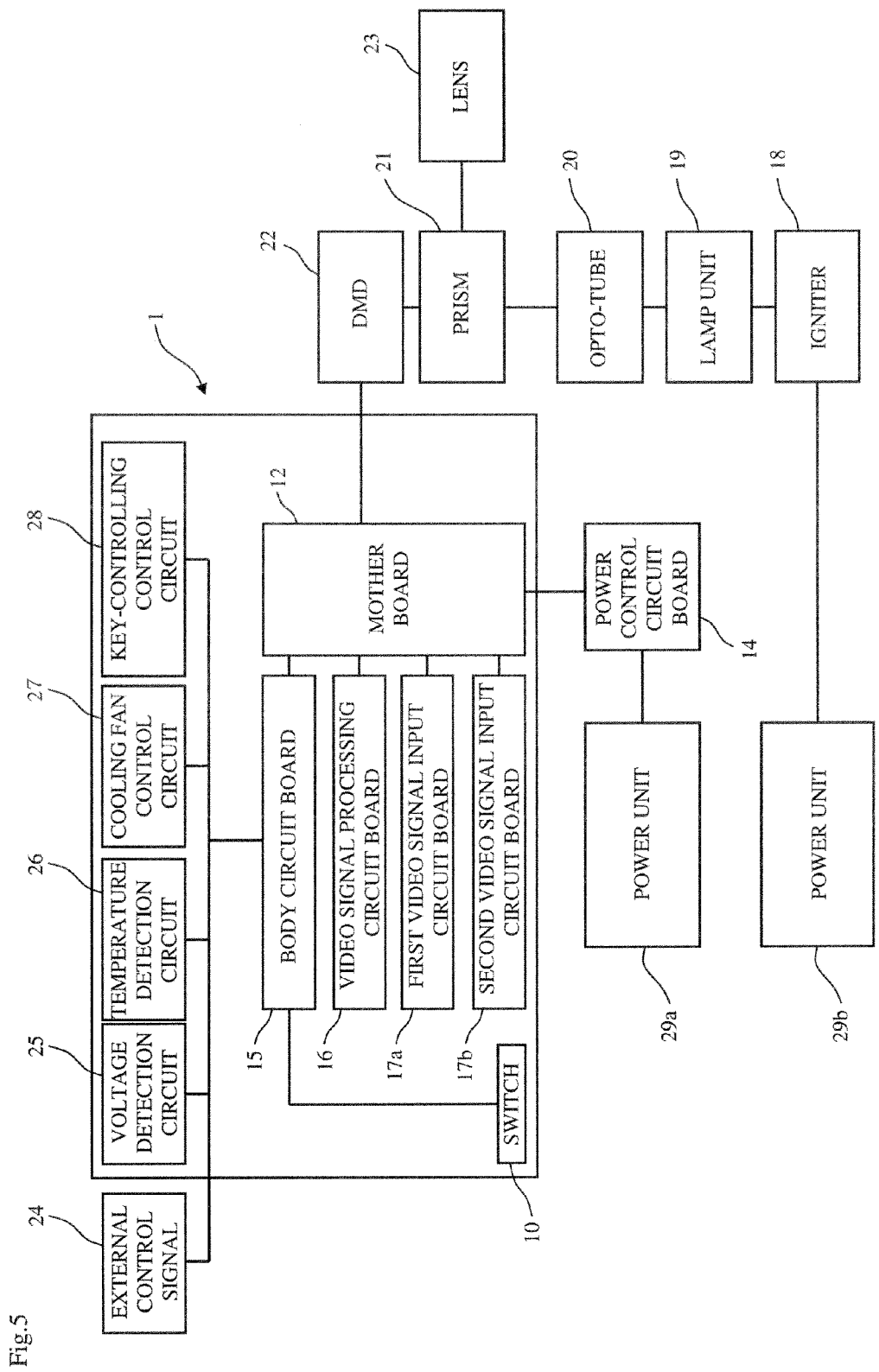
FIG. 5 is a block diagram showing a circuit configuration example of a video device.

FIG. 5 is a block diagram showing a circuit configuration example (DLP: Digital Light Processing) of a video device. Circuit components of the video device are not directly related to the present invention, and thus a detailed configuration is omitted.

As shown in FIG. 5, a video device body includes, in addition to circuit boards 5a, 5b, 5c, and 5d, mother board 12, and switch 10 stored in electronic equipment cabinet 1, power units 29a and 29b, power control circuit board 14, igniter 18, lamp unit 19, opto-tube 20, prism 21, DMD (Digital Micromirror Device) driving circuit 22, and lens 23. In this exemplary embodiment, circuit boards 5a, 5b, 5c, and 5d are respectively body control circuit board 15, video signal processing circuit board 16, first video signal input circuit board 17a, and second video signal input circuit board 17b.

Body control circuit board 15 includes voltage detection circuit 25, temperature detection circuit 26, cooling fan control circuit 27, and key-controlling control circuit 28. Body control circuit board 15 has a function of detecting a contact state between driving member 9 and switch 10. Video signal input circuit board 17a and 17b include input terminals for receiving video signals, and the input terminals are exposed to the outside of cover members 3c and 3d. Video signal processing circuit board 16 includes a processing circuit that processes a video signal.

When power unit 29a is turned on, power is supplied through power control circuit board 14 and mother board 12 to DMD driving circuit 22, body control circuit board 15, video signal processing circuit board 16, and video signal input circuit boards 17a and 17b to be driven. After a video signal has been transmitted from the input terminal to video signal input circuit board 17a or 17b, video signal processing circuit board 16 processes the video signal to transmit it through mother board 12 to DMD driving circuit 22.

When power unit 29b is turned on, igniter 18 applies ignition voltage to lamp unit 19 to light it. Light from the lamp is transmitted through opto-tube 20 to enter prism 21. The light, which has been separated into R, G, and B colors by prism 21, is reflected by a DMD controlled by DMD driving circuit 22, and transmitted through lens 23 to be projected on a screen.

Further, when switch 10 and driving member 9 (FIG. 4) are set in a noncontact state, body control circuit board 15 immediately responds to stop security processing of the video signal. A signal is also transmitted from body control circuit board 15 to video signal processing circuit board 16 to stop the video processing.

The use of abovementioned electronic equipment cabinet 1 and cover members 3a, 3b, 3c, and 3d enables reduction of the number of switchers 10 to detect storage states of circuit board units 2a, 2b, 2c, and 2d. As a result, the number of components and the influence of EMI can be reduced.

In electronic equipment cabinet 1 shown in FIGS. 2 to 4, switch 10 is disposed in lowermost slot 6d. However, the location of switch 10 is not limited to lowermost slot 6d. For example, as shown in FIG. 6, bases 4a, 4b, 4c, and 4d can be located at the upper ends of cover members 3a, 3b, 3c, and 3d, while gaskets 8a, 8b, 8c, and 8d can be located at the lower ends.

This arrangement inhibits pulling-out of circuit board units 2b, 2c, and 2d before circuit board unit 2a is pulled out from gasket 6a. In this case, switch 10 is located to detect a storage state of circuit board unit 2a in slot 6a.

Furthermore, the present invention can be applied to a case where circuit board unit 2c stored in slot 6c between the uppermost layer and the lowermost layer fixes circuit board units 2a, 2b, and 2d. Specifically, as shown in FIG. 7, switch 10 is located to detect a storage state of circuit board unit 2c.

The present invention has been described by referring to the exemplary embodiments. However, the present invention is not limited to the exemplary embodiments. Various changes understandable to those skilled in the art can be made to the configuration and the specifics of the present invention within its technical teachings.

DESCRIPTION OF REFERENCE NUMERALS 1 electronic equipment cabinet
2a, 2b, 2c, 2d circuit board unit
3a, 3b, 3c, 3d cover member
4a, 4b, 4c, 4d base
6a, 6b, 6c, 6d slot
8a, 8b, 8c, 8d gasket
9 driving member
10 switch

What is claimed is:

1. An electronic equipment cabinet for storing a plurality of circuit board units inserted and extracted in the same direction, comprises:
    a plurality of slots for storing the circuit board units;
    a plurality of cover members for covering the slots; and
    a switch for detecting closing of all the slots,
    wherein the cover members, which are provided by a plurality of types having an installation order restricting mechanism for preventing closing of the slots, except for when the cover members are installed according to a preset installation order, includes a driving member located in a final-installation cover member that is installed last and configured to drive the switch.

2. The electronic equipment cabinet according to claim 1, wherein the second cover member is removed from the slot by pulling away the first cover member.

3. The electronic equipment cabinet according to claim 1, wherein the cover members comprise conductive materials.

4. The electronic equipment cabinet according to claim 1, wherein:
    the plurality of types of cover members includes:
    the first cover member installed first; and
    the second cover member installed while the final-installation cover member is installed after the first cover member has been installed; and
    the installation order restricting mechanism includes:
    a gasket part abutting on the cabinet and a base abutting on the second cover member, which are formed in the first cover member;
    a gasket part abutting on the base of the first cover member and a base abutting on the final-installation cover member, which are formed in the second cover member; and
    a gasket part abutting on the base of the second cover member and a base abutting on the cabinet, which are formed in the final-installation cover member.

5. The electronic equipment cabinet according to claim 4, wherein the gasket parts include gaskets comprising conductive materials.

6. The electronic equipment cabinet according to claim 2, wherein the cover members comprise conductive materials.

7. The electronic equipment cabinet according to claim 2, wherein:
    the plurality of types of cover members includes:
    the first cover member installed first; and
    the second cover member installed while the final-installation cover member is installed after the first cover member has been installed; and
    the installation order restricting mechanism includes:
    a base formed in the first cover member to abut on a gasket part abutting on the cabinet and the second cover member;
    a base formed in the second cover member to abut on a gasket part abutting on the base of the first cover member and the final-installation cover member; and
    a base formed in the final-installation cover member to abut on a gasket part abutting on the base of the second cover member and the cabinet.

8. The electronic equipment cabinet according to claim 3, wherein:
    the plurality of types of cover members includes:
    the first cover member installed first; and
    the second cover member installed while the final-installation cover member is installed after the first cover member has been installed; and
    the installation order restricting mechanism includes:
    a base formed in the first cover member to abut on a gasket part abutting on the cabinet and the second cover member;
    a base formed in the second cover member to abut on a gasket part abutting on the base of the first cover member and the final-installation cover member; and a base formed in the final-installation cover member to abut on a gasket part abutting on the base of the second cover member and the cabinet.

* * * * *